United States Patent
Park et al.

(10) Patent No.: US 9,955,614 B2
(45) Date of Patent: Apr. 24, 2018

(54) SHEET FOR SHIELDING AGAINST ELECTROMAGNETIC WAVES AND WIRELESS POWER CHARGING DEVICE

(71) Applicant: SAMSUNG ELECTRO-MECHANICS CO., LTD., Suwon-si, Gyeonggi-do (KR)

(72) Inventors: Doo Ho Park, Suwon-si (KR); Jung Young Cho, Suwon-si (KR); Jong Ho Chung, Suwon-si (KR); Sung Yeol Park, Suwon-si (KR); Sung Nam Cho, Suwon-si (KR); Seung Min Lee, Suwon-si (KR); Seung Hee Oh, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/061,632

(22) Filed: Mar. 4, 2016

(65) Prior Publication Data
US 2016/0345472 A1 Nov. 24, 2016

(30) Foreign Application Priority Data

May 22, 2015 (KR) .................. 10-2015-0072173
Jul. 27, 2015 (KR) .................. 10-2015-0105737

(51) Int. Cl.
*H05K 9/00* (2006.01)
*H02J 7/02* (2016.01)
*H01F 27/36* (2006.01)
*H01F 38/14* (2006.01)

(52) U.S. Cl.
CPC ......... *H05K 9/0075* (2013.01); *H01F 27/365* (2013.01); *H02J 7/025* (2013.01); *H01F 38/14* (2013.01)

(58) Field of Classification Search
None
See application file for complete search history.

(56) References Cited

U.S. PATENT DOCUMENTS 5,639,989 A * 6/1997 Higgins ............... H01L 23/552
174/386
7,981,528 B2 * 7/2011 Nakatani .......... G06K 19/07749
428/692.1

(Continued)

FOREIGN PATENT DOCUMENTS

| JP | 2001053485 A | * | 2/2001 |
| JP | 2015-505166 A | | 2/2015 |
| WO | 2008/114764 A1 | | 9/2008 |

OTHER PUBLICATIONS

Derwent Abstract of JP 2001-053485 A (pub. 2001).*
Derwent Abstract of DE 102013103268 A1 (pub. 2014).*
History of Adhesives NPL article (1991).*

*Primary Examiner* — Kevin M Bernatz
(74) *Attorney, Agent, or Firm* — McDermott Will & Emery LLP

(57) ABSTRACT

A sheet for shielding against electromagnetic waves and a wireless power charging device are provided. The sheet for shielding against electromagnetic waves includes a plurality of magnetic layers and an adhesive layer interposed between the plurality of magnetic layers and forming chemical bonds with an adjacent magnetic layer.

14 Claims, 4 Drawing Sheets

(56) References Cited

U.S. PATENT DOCUMENTS

| | | | | |
|---|---|---|---|---|
| 8,809,687 B2* | 8/2014 | Watanabe | H05K 1/028 | 174/254 |
| 8,889,570 B2* | 11/2014 | Matsumura | B32B 27/08 | 174/388 |
| 9,252,611 B2* | 2/2016 | Lee | H01F 38/14 | |
| 2004/0108486 A1* | 6/2004 | Yoshida | H01F 1/22 | 252/62.54 |
| 2005/0089708 A1* | 4/2005 | Maruko | C22C 45/04 | 428/611 |
| 2006/0078983 A1* | 4/2006 | Lau | B01J 19/0046 | 435/287.1 |
| 2006/0083948 A1* | 4/2006 | Kawaguchi | H01F 10/08 | 428/692.1 |
| 2006/0199004 A1* | 9/2006 | Lee | B32B 3/266 | 428/344 |
| 2007/0047278 A1* | 3/2007 | Yamamoto | H01L 23/49582 | 363/144 |
| 2007/0196671 A1* | 8/2007 | Kobayashi | B82Y 25/00 | 428/447 |
| 2009/0261414 A1* | 10/2009 | Oikawa | H01L 21/568 | 257/347 |
| 2010/0147451 A1* | 6/2010 | Morillo | C09J 5/02 | 156/245 |
| 2010/0147578 A1 | 6/2010 | Matsumura et al. | | |
| 2012/0236528 A1* | 9/2012 | Le | H05K 9/0088 | 361/818 |
| 2014/0176380 A1* | 6/2014 | Choi | H01Q 1/38 | 343/787 |
| 2014/0320369 A1* | 10/2014 | Azenui | H01Q 1/526 | 343/841 |
| 2015/0109179 A1* | 4/2015 | Ryu | H01Q 9/0407 | 343/788 |
| 2015/0123604 A1 | 5/2015 | Lee et al. | | |
| 2015/0163903 A1* | 6/2015 | Wada | H05K 3/321 | 361/760 |
| 2015/0235121 A1* | 8/2015 | Pavate | G06K 19/07783 | 235/492 |
| 2016/0057900 A1* | 2/2016 | Polak | H01F 27/365 | 320/108 |
| 2016/0064814 A1* | 3/2016 | Jang | H01Q 1/526 | 343/842 |

\* cited by examiner

SHEET FOR SHIELDING AGAINST ELECTROMAGNETIC WAVES AND WIRELESS POWER CHARGING DEVICE

CROSS-REFERENCE TO RELATED APPLICATION

This application claims the benefit of priority to Korean Patent Application Nos. 10-2015-0072173 and 10-2015-0105737, filed on May 22, 2015 and Jul. 27, 2015, respectively, with the Korean Intellectual Property Office, the entirety of which is incorporated herein by reference.

TECHNICAL FIELD

The present disclosure relates to a sheet for shielding against electromagnetic waves and a wireless power charging device.

BACKGROUND

As various electronic devices have been reduced in weight due to a reduction in size, a wireless power charging scheme for charging a battery using magnetic coupling (or inductive coupling) without electrical contact has come into prominence.

A wireless power charging scheme is a scheme in which charging is performed through the use of electromagnetic induction. A primary coil (transmitter coil) is provided in a charger (wireless power transmitting device), a secondary coil (receiver coil) is provided in a charge target (wireless power receiving device), and a current is generated according to inductive coupling between the primary coil and the secondary coil. This current provides energy used to charge a battery.

A sheet for shielding against electromagnetic waves (or a shielding sheet) is disposed between the receiver coil and the battery. The shielding sheet serves to block a magnetic field generated by the receiver coil from reaching the battery and to allow electromagnetic waves generated by the wireless power transmitting device to be effectively transmitted to the wireless power receiving device.

In the sheet for shielding against electromagnetic waves, an eddy current may be generated due to electromotive force resulting from a change in magnetic flux within a magnetic material. The eddy current may cause power loss and an increase in temperature of the magnetic material. Also, a magnetic field generated by the eddy current may inversely act on a direction of a magnetic field generated by the transmitter, significantly degrading charging efficiency.

SUMMARY

An aspect of the present disclosure provides a thinner sheet for shielding against electromagnetic waves and a thinner wireless power charging device.

An aspect of the present disclosure also provides a sheet for shielding against electromagnetic waves, and a wireless power charging device capable of enhancing heating characteristics and power charging efficiency by reducing an influence of an eddy current.

According to an aspect of the present disclosure, a novel structure of a sheet for shielding against electromagnetic waves is provided, which advantageously reduces thickness and an eddy current. In detail, the sheet for shielding against electromagnetic waves includes a plurality of magnetic layers and an adhesive layer interposed therebetween. The adhesive layer forms chemical bonds with a material forming adjacent magnetic layers, providing excellent adhesion and having significantly reduced thickness, compared with a conventionally used physical adhesive.

For example, in a case in which the magnetic layers are formed as a metal ribbon formed of an Fe—Si—B alloy and the adhesive layer is formed of organosilane, oxygen of the material forming the adhesive layer forms chemical bonds with silicon (Si) of the magnetic layers. Details thereof will be described in detail hereinafter with reference to the accompanying drawings.

Also, in a principal example of another exemplary embodiment of the present disclosure, the magnetic layer is provided as having a structure fractured into a plurality of fragments to reduce an eddy current, and the adhesive layer forming chemical bonds may fill spaces between the plurality of fragments. Through this structure, the fractured fragments may be prevented from being in contact to be electrically connected with each other, providing a more advantageous configuration for reducing an eddy current.

According to an aspect of the present disclosure, a sheet for shielding against electromagnetic waves comprises: a plurality of magnetic layers; and an adhesive layer interposed between the plurality of magnetic layers and forming chemical bonds with an adjacent magnetic layer.

The plurality of magnetic layers may include a metal ribbon.

The plurality of magnetic layers may include a material containing silicon (Si).

The plurality of magnetic layers may include an Fe—Si—B alloy.

The adhesive layer may contain organosilane.

Oxygen of a material forming the adhesive layer may form chemical bonds with silicon (Si) of the plurality of magnetic layers.

The sheet may have a thickness of 1 μm or less.

A magnetic layer among the plurality of magnetic layers may include a plurality of fragments.

The adhesive layer may fill spaces between the plurality of fragments.

A content of Fe may be between 70 and 90 atomic %; and a sum of the content of silicon (Si) and boron (B) may be between 10 and 30 atomic %.

A content of chromium (Cr) or cobalt (Co) may be greater than 0 and less than or equal to 20 atomic %.

According to another aspect of the present disclosure, a wireless power charging device comprises a coil unit; and an electromagnetic wave blocking sheet disposed between the coil unit and an external battery, and including a plurality of magnetic layers and an adhesive layer interposed between the plurality of magnetic layers and forming chemical bonds with adjacent magnetic layers.

BRIEF DESCRIPTION OF THE DRAWINGS

The above and other aspects, features, and advantages of the present disclosure will be more clearly understood from the following detailed description taken in conjunction with the accompanying drawings, in which.

DETAILED DESCRIPTION

Figure 1:
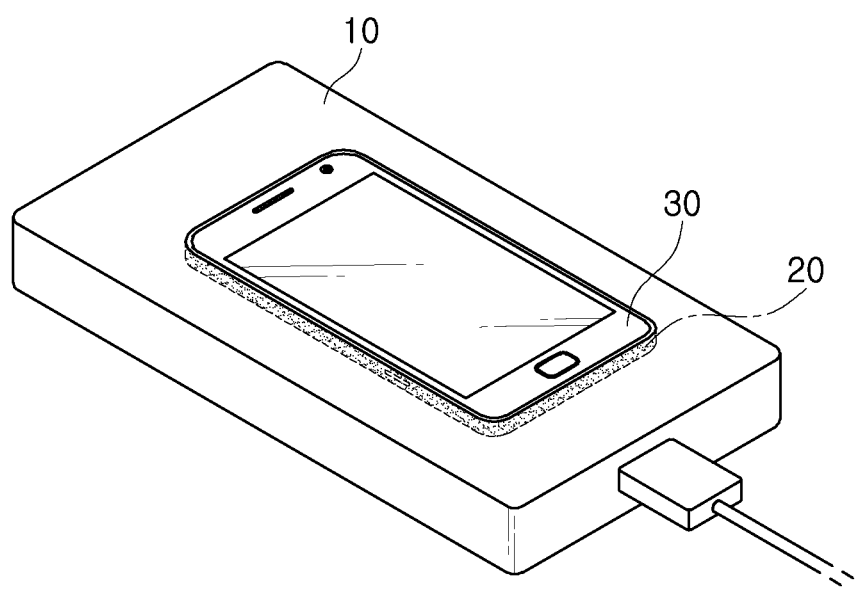
FIG. 1 is an external perspective view of a general wireless charging system.

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "upper," or "above" other elements would then be oriented "lower," or "below" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted by one or a combination thereof.

The contents of the present inventive concept described below may have a variety of configurations and propose only a required configuration herein, but are not limited thereto.

Figure 2:
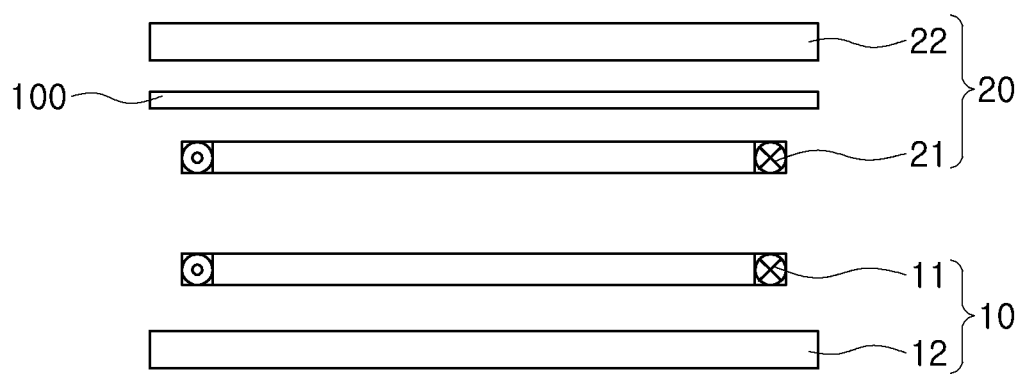
FIG. 2 is an exploded cross-sectional view illustrating major internal components of FIG. 1.

FIG. 1 is an external perspective view of a general wireless charging system, and FIG. 2 is an exploded cross-sectional view illustrating major internal components of FIG. 1.

Referring to FIGS. 1 and 2, a general wireless charging system may include a wireless power transmitting device 10 and a wireless power receiving device 20. The wireless power receiving device 20 may be included in an electronic device 30 such as a mobile phone, a laptop computer, or a tablet PC.

Regarding the interior of the wireless power transmitting device 10, a transmitter coil 11 is formed on a substrate 12, and when an alternating current (AC) voltage is applied to the wireless power transmitting device 10, a magnetic field is formed around the transmitter coil 11. Accordingly, electromotive force induced from the transmitter coil 11 is generated in a receiver coil 21 installed in the wireless power receiving device 20 to charge a battery 22.

The battery 22 may be, for example, a nickel metal hydrogen battery or a lithium ion battery which may be charged or discharged, but is not limited thereto. Also, the battery 22 may be configured to be separated from the wireless power receiving device 20 and detachably attached to the wireless power receiving device 20, or may be integrally configured with the wireless power receiving device 20.

The transmitter coil 11 and the receiver coil 21 may be electromagnetically coupled, and may be formed by winding a metal wire such as copper therearound. The metal wire may be wound in a circular, oval, quadrangular, or a diamond shape, for example, and an overall size or the number of windings may be appropriately controlled to be set according to required characteristics.

A sheet 100 for shielding against electromagnetic waves (hereinafter referred to as an "electromagnetic wave blocking sheet 100") may be disposed between the receiver coil 21 and the battery 22. The electromagnetic wave blocking sheet 100 positioned between the receiver coil 21 and the battery 22 may concentrate magnetic flux to be effectively received by the receiver coil 21. The electromagnetic wave blocking sheet 100 may also serve to block at least a portion of magnetic flux from reaching the battery 22. Hereinafter, the electromagnetic wave blocking sheet 100 will be described in detail.

Figure 3:
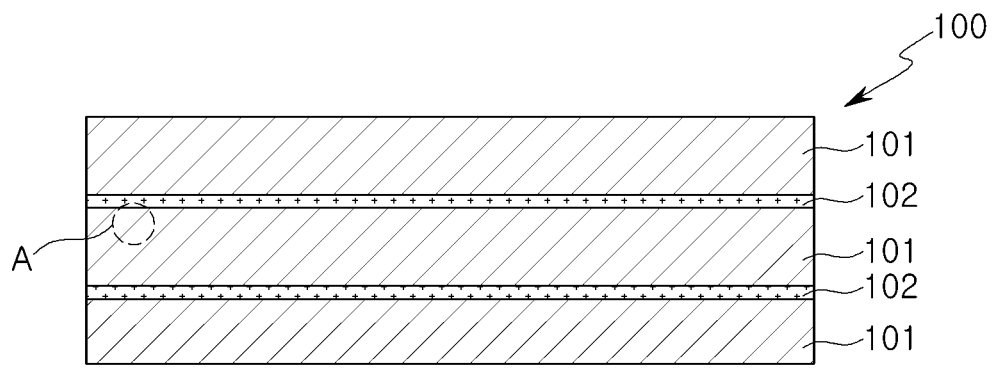
FIG. 3 is a cross-sectional view schematically illustrating a sheet for shielding against electromagnetic waves according to an exemplary embodiment in the present disclosure.

FIG. 3 is a cross-sectional view schematically illustrating a sheet for shielding against electromagnetic waves according to an exemplary embodiment. The electromagnetic wave blocking sheet 100 includes a plurality of magnetic layers 101 and adhesive layers 102 interposed therebetween. The plurality of magnetic layers 101 may have a structure stacked in a thickness direction, and a stacking number may be appropriately adjusted according to an intended blocking function or a size of an electronic device.

As the magnetic layer 101 for concentrating or blocking an electromagnetic wave, a thin plate metal ribbon formed of an amorphous alloy or a nanocrystalline alloy may be used. Here, as the amorphous alloy, an Fe-based or Co-based magnetic alloy may be used. The Fe-based magnetic alloy may be, for example, an Fe—Si—B alloy. As the content of a metal including Fe is increased, a saturation magnetic flux density may be increased, but an excess of the content of Fe makes it difficult to become amorphous. Thus, the content of Fe may range from 70 to 90 atomic %, and the best amorphous forming ability of the alloy may be obtained when the sum of silicon (Si) and boron (B) ranges from 10 to 30 atomic %. With respect to the basic composition, a corrosion-resistant element such as chromium (Cr) or cobalt (Co) may be added in an amount of 20 atomic % to prevent corrosion, or a small amount of other metal elements may be added in order to provide other characteristics.

In the case of using a nanocrystalline alloy, an Fe-based nanocrystalline magnetic alloy may be used. As the Fe-based nanocrystalline magnetic alloy, an Fe—Si—B—Cu—Nb alloy may be used.

The adhesive layer 102 serves to bond the magnetic layers 101, as well as insulating the magnetic layers 101, and in the present exemplary embodiment, the adhesive layer 102 forms chemical bonds with a material forming the magnetic layer 101. The bonding scheme based on chemical bonds is distinguished from a physical bonding scheme using conventionally used adhesive tape, or the like, by which thickness of the electromagnetic wave shielding sheet may be significantly reduced. Also, when the magnetic layer 101 is bonded through chemical bonds, better adhesion may be provided, advantageously providing structural stability for the electromagnetic wave blocking sheet 100.

The aforementioned chemical bonding scheme will be described with reference to FIGS. 4 and 5.

Figure 4:
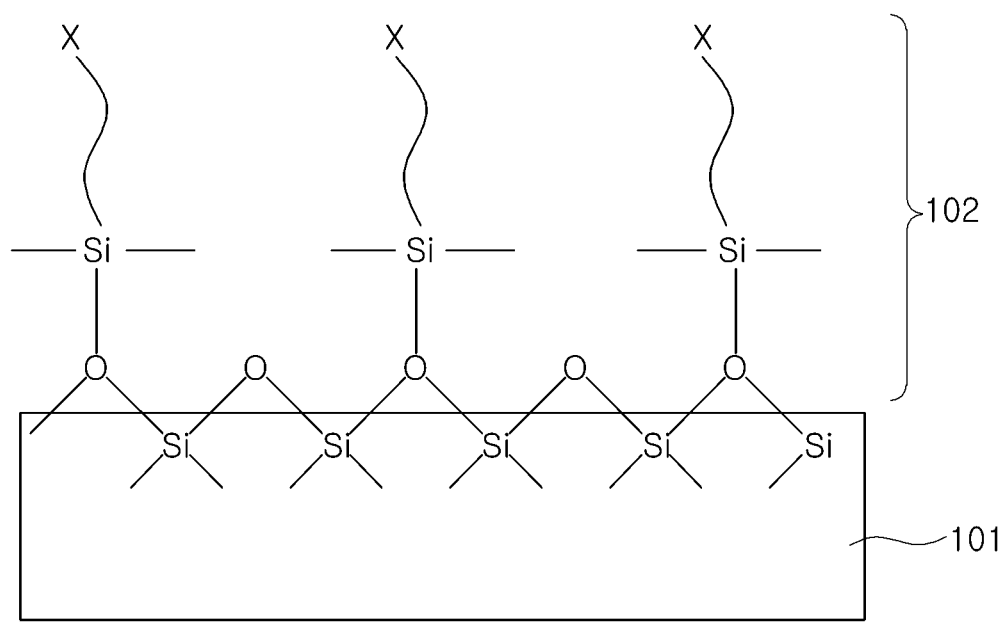
FIG. 4 is an enlarged view of a region "A" of the sheet for shielding against electromagnetic waves of FIG. 3, illustrating chemical bonds formed between a surface of a magnetic layer and an adhesive layer.
Figure 5:
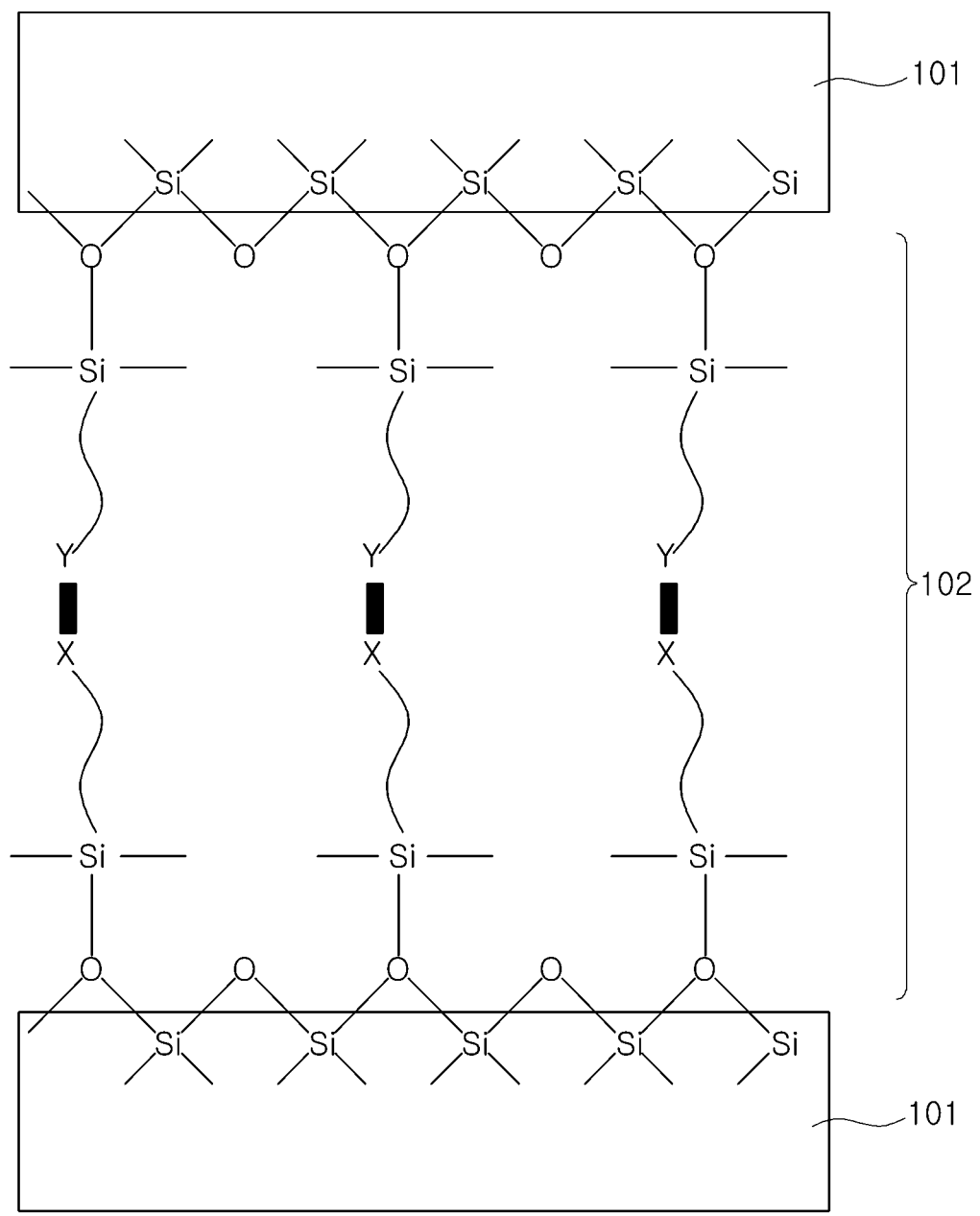
FIG. 5 is a view schematically illustrating a configuration in which adjacent magnetic layers are bonded by an adhesive layer.

FIG. 4 is an enlarged view of a region "A" of the sheet for shielding against electromagnetic waves of FIG. 3, illustrating chemical bonds formed between a surface of the magnetic layer 101 and the adhesive layer 102. FIG. 5 is a view schematically illustrating a configuration in which adjacent magnetic layers 101 are bonded by the adhesive layer 102. As an example, the adhesive layer 102 illustrated in FIGS. 4 and 5 may be formed of a material including organosilane forming chemical bonds. In this case, oxygen (O) of the material of the adhesive layer 102 may form chemical bonds with silicon (Si) of the magnetic layer 101 so as to be chemically bonded.

In order to form the adhesive layer 102 on a surface of the magnetic layer 101, a method of applying organosilane in a sol-gel state to the surface of the magnetic layer 101 and inducing chemical bonds may be used.

Due to the adhesive layer 102 using chemical bonds as in the present exemplary embodiment, adhesion between the plurality of magnetic layers 101 may be enhanced, and the thickness of the adhesive layer 102 may be significantly reduced. In a specific example, when the adhesive layer 102 using chemical bonds is used, thickness of the electromagnetic wave shielding sheet 100 may be reduced to a level of about 1 µm or less, and this is appropriate for slim electronic devices, compared to a sheet including a physical adhesive layer generally having a thickness of 10 µm or greater.

Figure 6:
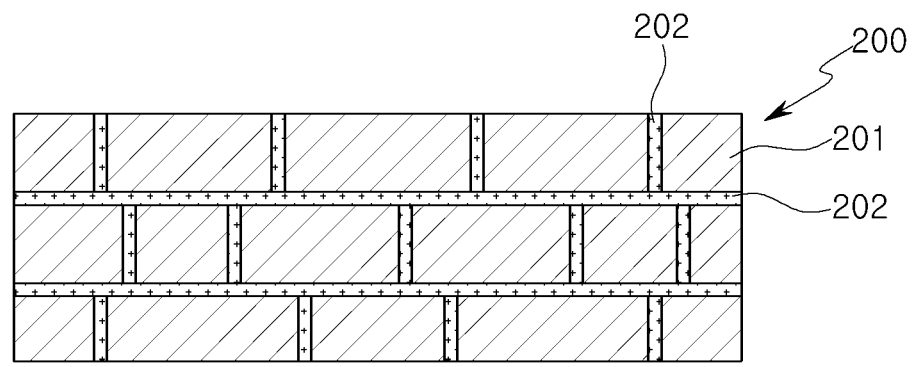
FIG. 6 is a cross-sectional view schematically illustrating a magnetic sheet according to another exemplary embodiment in the present disclosure.

FIG. 6 is a cross-sectional view schematically illustrating a magnetic sheet according to another exemplary embodiment. An electromagnetic wave shielding sheet 200 illustrated in FIG. 6 has a structure in which a plurality of magnetic layers 201 are stacked, as in the previous exemplary embodiment. An adhesive layer 202 is interposed between the plurality of magnetic layers 201 and forms chemical bonds with a material forming the magnetic layers 201 to provide an adhesive function. In the present exemplary embodiment, the magnetic layers 201 are fractured into a plurality of fragments, forming an electrically insulating structure to reduce an influence of an eddy current. Also, as illustrated in FIG. 6, the adhesive layer 202 fills a space between the plurality of fragments in the magnetic layers 201, and, through this structure, the fractured fragments may be prevented from being in contact to be electrically connected with each other, providing a more advantageous configuration for reducing an eddy current.

Figure 7:
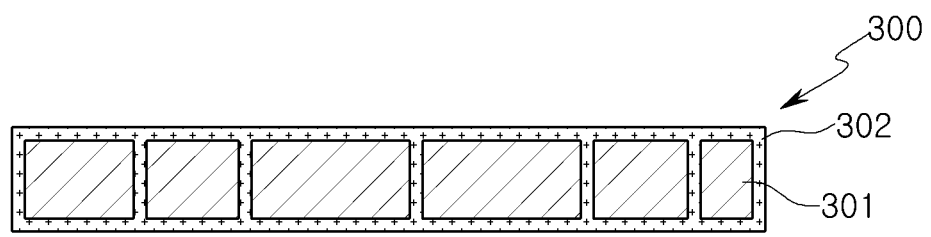
FIG. 7 is a cross-sectional view schematically illustrating a magnetic sheet according to another exemplary embodiment in the present disclosure.

FIG. 7 is a cross-sectional view schematically illustrating a magnetic sheet according to another exemplary embodiment. An electromagnetic wave shielding sheet 300 illustrated in FIG. 7 has a structure in which a magnetic layer 301 is fractured into a plurality of fragments, and the fragments are each coated by an insulating layer 302. Thus, the fractured fragments may be prevented from being in contact to be electrically connected with each other, more advantageously reducing an eddy current.

Here, the insulating layer 302 may be formed by oxidizing interfaces between the fractured fragments by using a liquid phase method or a chemical vapor deposition (CVD) method after the magnetic layer 301 is fractured, and the insulating layer 302 may be formed to have a tens of nanometer scale. In the exemplary embodiment of FIG. 7, only a single magnetic layer 301 is illustrated. However, similar to the previous exemplary embodiment, a plurality of magnetic layers may be stacked, and also, a protective layer may be formed on upper and lower surfaces of the magnetic layer 301.

As set forth above, in the sheet for shielding against electromagnetic waves and the wireless power charging device according to exemplary embodiments, thickness of the adhesive layer bonding the magnetic layers may be significantly reduced, and thus, the thickness of electronic devices may be advantageously reduced.

In addition, the use of the electromagnetic wave blocking sheet and the wireless power charging device may reduce an influence of an eddy current, enhancing heating characteristics and power charging efficiency.

While exemplary embodiments have been shown and described above, it will be apparent to those skilled in the art that modifications and variations could be made without departing from the scope of the present invention as defined by the appended claims.

What is claimed is:

1. A sheet for shielding against electromagnetic waves, the sheet comprising:
   a plurality of magnetic layers including silicon (Si); and
   an organosilane layer interposed between the plurality of magnetic layers, and directly bonded with two of the plurality of magnetic layers by silicon-oxygen bonds, wherein the sheet has a thickness of 1 µm or less.

2. The sheet of claim 1, wherein the plurality of magnetic layers includes a metal ribbon.

3. The sheet of claim 1, wherein the plurality of magnetic layers includes an Fe—Si—B alloy.

4. The sheet of claim 3, wherein: in the Fe—Si—B alloy,
a content of Fe is between 70 and 90 atomic %; and
a sum of the content of silicon (Si) and boron (B) is between 10 and 30 atomic %.

5. The sheet of claim 4, wherein in the Fe—Si—B alloy, a content of chromium (Cr) or cobalt (Co) is greater than 0 and less than or equal to 20 atomic %.

6. The sheet of claim 1, wherein silicon (Si) of the two of the plurality of magnetic layers and oxygen of the organosilane layer forms the silicon-oxygen bonds.

7. The sheet of claim 1, wherein a magnetic layer among the plurality of magnetic layers includes a plurality of fragments.

8. The sheet of claim 7, wherein the organosilane layer fills spaces between the plurality of fragments.

9. A wireless power charging device comprising:
a coil unit; and
an electromagnetic wave blocking sheet disposed between the coil unit and an external battery, and including:
a plurality of magnetic layers including silicon (Si); and
an organosilane layer interposed between the plurality of magnetic layers, and directly bonded with two of the plurality of magnetic layers by silicon-oxygen bonds,
wherein the sheet has a thickness of 1 μm or less.

10. The wireless power charging device of claim 9, wherein the plurality of magnetic layers includes a metal ribbon.

11. The wireless power charging device of claim 9, wherein the plurality of magnetic layers includes an Fe—Si—B alloy.

12. The wireless power charging device of claim 9, wherein silicon (Si) of the two of the plurality of magnetic layers include silicon (Si) and oxygen of the organosilane layer forms the silicon-oxygen bonds.

13. The wireless power charging device of claim 9, wherein a magnetic layer among the plurality of magnetic layers includes a plurality of fragments.

14. The wireless power charging device of claim 13, wherein the organosilane layer fills spaces between the plurality of fragments.

* * * * *